United States Patent
Ishikawa et al.

(10) Patent No.: US 7,524,709 B2
(45) Date of Patent: Apr. 28, 2009

(54) MANUFACTURING METHOD FOR A DISPLAY DEVICE

(75) Inventors: Akira Ishikawa, Utsunomiya (JP); Tetsuji Yamaguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 51 days.

(21) Appl. No.: 11/698,862

(22) Filed: Jan. 29, 2007

(65) Prior Publication Data

US 2007/0128769 A1      Jun. 7, 2007

Related U.S. Application Data

(62) Division of application No. 10/976,882, filed on Nov. 1, 2004, now Pat. No. 7,170,176.

(30) Foreign Application Priority Data

Nov. 4, 2003     (JP) ............................ 2003-375038

(51) Int. Cl.
*H01L 21/441* (2006.01)
(52) U.S. Cl. .................. 438/151; 438/622; 257/758; 257/E21.017
(58) Field of Classification Search .............. 438/637, 438/622, 151; 257/E21.015–E21.021; 349/56; 313/504
See application file for complete search history.

(56) References Cited

U.S. PATENT DOCUMENTS

| 5,202,579 | A |   | 4/1993  | Fujii et al. |
|-----------|---|---|---------|--------------|
| 5,290,729 | A |   | 3/1994  | Hayashide et al. |
| 5,313,101 | A | * | 5/1994  | Harada et al. ............ 257/758 |
| 5,341,026 | A |   | 8/1994  | Harada et al. |
| 5,554,888 | A |   | 9/1996  | Kato |
| 5,665,642 | A |   | 9/1997  | Kato |
| 5,801,093 | A |   | 9/1998  | Lin |
| 6,400,031 | B1 |  | 6/2002  | Harada |
| 2003/0047810 | A1 | * | 3/2003 | Maeda et al. ............ 257/758 |
| 2004/0090175 | A1 |   | 5/2004 | Urabe et al. |
| 2004/0125265 | A1 |   | 7/2004 | Koo et al. |
| 2005/0200300 | A1 |   | 9/2005 | Yumoto |
| 2005/0282304 | A1 |   | 12/2005 | Inoue et al. |

FOREIGN PATENT DOCUMENTS

| JP | 06-314687 | 11/1994 |
|----|-----------|---------|
| JP | 08-306779 | 11/1996 |

* cited by examiner

*Primary Examiner*—Jerome Jackson, Jr.
*Assistant Examiner*—Paul A Budd
(74) *Attorney, Agent, or Firm*—Eric J. Robinson; Robinson Intellectual Property Law Office, P.C.

(57) ABSTRACT

A technology for easily forming a multi-layer wiring structure that is fine and reliable. In the multi-layer wiring structure, the lower-layer wiring and the upper-layer wiring that are formed to sandwich an insulating layer are electrically connected to each other in a projection formed in the lower-layer wiring. The projection includes a columnar conductive member and the upper and lower layers thereof and each of the lower layer and the upper layer is formed of a conductive layer formed over the entire lower-layer wiring. The upper-layer is electrically connected to the lower-layer wiring in the portion where the projection is exposed substantially on the same plane as the top surface of the insulating layer.

16 Claims, 11 Drawing Sheets

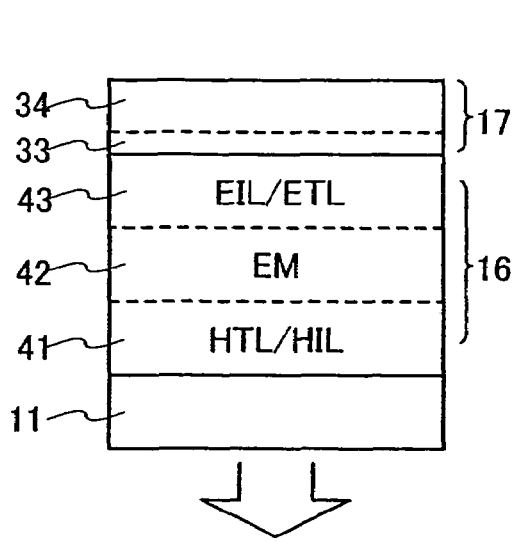
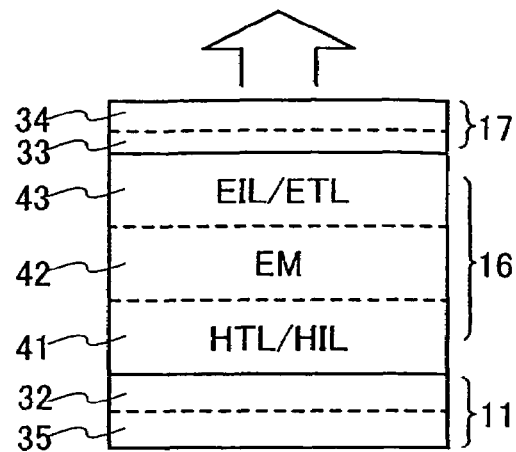
FIG. 9A  FIG. 9B
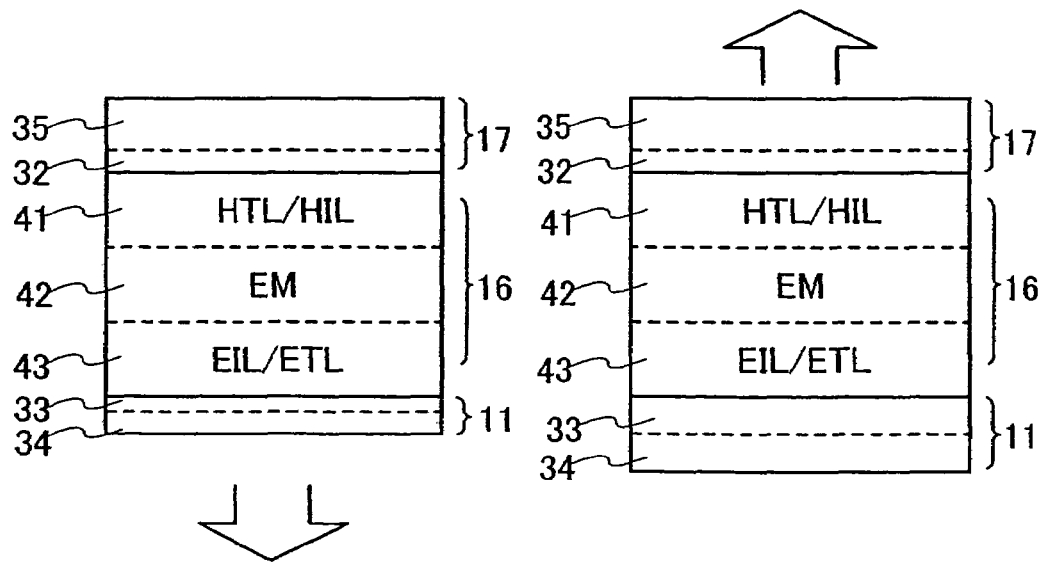
FIG. 10A  FIG. 10B

MANUFACTURING METHOD FOR A DISPLAY DEVICE

BACKGROUND OF THE INVENTION

1. Field of the Invention

The present invention relates to a semiconductor device having a multi-layer wiring structure, and more particularly to a technique for forming an electrical connection between wirings via an interlayer insulating film.

2. Description of the Related Art

Among wiring structures of what is called a semiconductor integrated circuit, multiple circuit elements of which are formed over/inside a substrate, there is known a multi-layer wiring structure in which different wiring layers are electrically insulated from each other using an insulating film containing silicon oxide and the like called an interlayer insulating film.

When wirings that are formed to sandwich an interlayer insulating film are brought into contact with each other, a method for obtaining a contact by forming an opening called a contact hole in the interlayer insulating film is adopted. In addition, in microfabrication technologies of a semiconductor integrated circuit, a method for interposing a columnar conductive member between the upper-layer wiring and the lower-layer wiring so as to obtain a contact has been developed. For example, a technique for obtaining a contact between the upper-layer wiring and the lower-layer wiring by providing a projecting conductive member on the lower-layer wiring is disclosed (see Patent Documents 1 and 2).

[Patent Document 1]
Japanese Patent Laid-Open No. 6-314687
[Patent Document 2]
Japanese Patent Laid-Open No. 8-306779

In the case of forming a multi-layer wiring structure, it is required that processes for forming wirings or those for forming an electrical connection between different wirings are not complex, but as simple as possible.

However, as for the method for forming the lower-layer wiring or a conductive film for the lower-layer wiring and subsequently forming a projecting conductive member thereover as in the conventional technology, the process can not be carried out unless a conductive film to serve as an etching stopper is interposed between the conductive film for the lower-layer wiring and a conductive film for forming the projecting conductive member, which is disadvantage in that it provides fewer alternatives for the material to be used.

When adopting steps for forming a conductive film from which the lower-layer wiring and a conductive film to form a projecting conductive member are formed, the resulting total film thickness is thick, which would bury a projecting discrimination pattern called an alignment marker formed in the lower layer in the photolithography step. Therefore, it is difficult to carry out alignment using a camera such as a CCD, hence is difficult to align a photomask with accuracy. Thus, there is a problem that fine pattern formation cannot be achieved.

In view of the following problems, it is a feature of the invention to provide a technology for easily forming a multi-layer wiring structure that is fine and reliable.

SUMMARY OF THE INVENTION

The invention provides a technology for easily obtaining an electrical connection between multi-layer wirings without the need of forming a contact hole having a high aspect ratio (ratio of the diameter to the depth of a contact hole). In a portion where the upper-layer wiring and the lower-layer wiring, which are insulated from each other by an interlayer insulating film, are to be electrically connected, a projection (hereinafter, also referred to as a "plug" or a "pillar") is provided in the lower-layer wiring, through which an electrical connection between the lower-layer wiring and the upper-layer wiring is obtained.

The invention provides a multi-layer wiring structure in which the lower-layer wiring and the upper-layer wiring that are formed to sandwich an insulating layer are connected to each other by the projection provided in the lower-layer wiring. The projection includes a columnar conductive member and the upper and lower layers thereof and each of the upper and lower layers is formed of a conductive film formed over the entire lower-layer wiring. The upper-layer wiring is electrically connected to the lower-layer wiring in the portion where the projection is exposed substantially on the same plane as the top surface of the insulating layer.

The invention provides a multi-layer wiring structure including the first insulating film formed with a contact hole, the first wiring formed over the first insulating film, and the second wiring formed over the first wiring with the second insulating film interposed therebetween, wherein an electrical connection between the first wiring and the second wiring is formed in a projection provided in the first wiring, and the contact hole is filled with a conductive material that is identical or similar to a columnar conductive member included in the projection. The projection includes the columnar conductive member and the upper and lower layers thereof, each of the upper and lower layers is formed of a conductive film formed over the entire lower-layer wiring, whereby the second wiring can be electrically connected to the first wiring in the portion where the projection is exposed on substantially the same plane as the top surface of the second insulating film.

The columnar conductive member is formed of aluminium or a metal material containing aluminium as its main component. Each of the conductive films forming the upper and lower layers of the columnar conductive member is preferably formed of a metal having a high melting point such as titanium, tantalum and tungsten, or nitride of such metal having a high melting point.

The projection, namely a plug for connecting the lower-layer wiring and the upper-layer wiring is formed of a single layer or a lamination of a plurality of layers. In the case of laminating a plurality of layers, the upper and lower layers and side faces of the conductive member for forming the projection are covered with conductive materials having heat resistance or electro migration resistance. That is, the columnar conductive member formed of a metal material such as Al, Cu, Ag and Au is desirably covered with barrier conductive films that can prevent diffusion of the metal. The barrier conductive films (hereinafter also referred to as "barrier layers") may be each formed of one or more of the materials such as Ti, Ta and W or a nitrogen compound or a carbon compound of Ti, Ta and W. Each of the barrier layers may be one or a plurality of layers formed of the above materials.

The invention comprises the steps of: forming the first conductive film over an entire main surface, forming the first mask over the first conductive film, etching the first conductive film, stopping the etching in the condition where at least a part of the first conductive film covers the main surface, thereby forming a columnar conductive member in the position where the mask is formed, forming the second conductive film and a hard mask layer over the main surface so as to cover the columnar conductive member, forming the second mask over the hard mask, performing an etching, stopping the etching in the condition where the region of the hard mask which is not covered by the second mask is removed and at least a part of the first conductive film or the second conductive film covers the main surface, removing the second mask, and removing the first conductive film or the second conductive film that remains over the main surface and that is not covered with the hard mask layer.

The invention comprises the steps of: forming a contact hole in the first insulating film, forming the first conductive film over the first insulating film and the contact hole, performing heat treatment so that the contact hole in the first insulating film is filled with a material of the first conductive film, forming the first mask over the first conductive film, etching the first conductive film, stopping the etching in the condition where at least a part of the first conductive film covers the first insulating film and fills in the contact hole, thereby forming a columnar conductive member in the position where the mask is formed, forming the second conductive film and a hard mask layer over the entire surface of the first insulating film so as to cover the columnar conductive member, and removing the first conductive film or the second conductive film that remains over the first insulating film and that is not covered with the hard mask layer.

The second conductive film preferably includes the first layer formed of a metal having a high melting point such as titanium, tantalum and tungsten, or nitride of such metal having a high melting point, and the second layer is preferably formed of aluminium or a metal material containing aluminium as its main component.

According to the invention, in the case of obtaining an electrical connection between wirings that are insulated from each other by an interlayer insulating film, the lower-layer wiring is formed with a projection and an interlayer insulating film is formed thereover. Then, the interlayer insulating film is selectively removed to expose the projection, and the upper wiring is formed thereover so as to obtain a multi-layer wiring structure. In the case of planarizing the interlayer insulating film, the projection is desirably shaped in such a manner that the projection is projected from the top surface of the interlayer insulating film, that the interlayer insulating film over the projection is selectively removed so as to form a depression, or that the projection is exposed on substantially the same plane as the top surface of the interlayer insulating film. In addition, the invention is advantageous in that an alignment mark that is necessary for the formation of the upper-layer wiring or a projection as a part of the upper-layer wiring can be formed by utilizing steps that are formed due to the projection of the lower-layer wiring.

According to the invention, the first conductive film is formed over the first barrier layer, which is then etched to form a columnar conductive member over the first barrier layer. Subsequently, the second barrier layer is formed so as to cover the columnar conductive member, over which the second conductive film is formed so as to obtain the lower-layer wiring including the projection. As for the lower-layer wiring buried in the interlayer insulating film, the surface of the projection can be exposed on substantially the same plane as the interlayer insulating film or in a projecting manner from the interlayer insulating film by performing etching or chemical or mechanical polishing to the surface of the interlayer insulating film to be removed. Subsequently, the upper-layer wiring is formed over the interlayer insulating film to overlap the exposed projection so as to obtain a multi-layer wiring structure.

The columnar conductive member is obtained by forming the first conductive film, forming the first mask thereover and then performing etching using the first mask. At this point, in the case where the first barrier layer is formed under the first conductive film, the first barrier layer remains. The second barrier layer is stacked so as to cover the projection, and the second conductive film is formed thereover so as to obtain the lower-layer wiring including the projection. It is needless to mention that the invention is not limited to the lower-layer wiring, and can be applied to the upper-layer wiring that is formed over the lower-layer wiring with the interlayer insulating film interposed therebetween. That is, by laminating wirings having such a projection in sequence, a multi-layer wiring structure can be obtained.

Such a projection allows the formation of a pattern narrower than a resolution limit of exposure treatment by performing what is called a slimming processing by which the width of the first mask to be transferred from a photomask is reduced. That is, a contact with finer patterns can be obtained, and thus an integrated circuit with higher density can be achieved.

In addition, according to the invention, the first barrier layer is formed over the first interlayer insulating film provided with a contact hole, and the first conductive film is formed thereover. Then, heat treatment is performed to fill in the contact hole with the first conductive film, which is called a reflow processing. Then, the first mask, a columnar conductive member formed of the first conductive film, the second barrier film covering the columnar conductive member, and the second conductive film are formed in sequence so as to obtain the lower-layer wiring including the projection. Subsequently, with the similar steps, the depression due to the contact hole formed in the first interlayer insulating film can be filled with the first conductive film, thus a multi-layer wiring structure in accordance with the invention can be obtained. The invention can be applied to the case where the lower-layer member to form a contact hole is not thick enough to perform a selective processing with ease, such as the case of using a polycrystalline semiconductor film or an SOI (Silicon on Insulator) substrate formed with a thickness of several ten to several hundred nanometer.

The interlayer insulating film may be an inorganic interlayer film, for example, such as a silicon oxide film formed by vapor phase growth or sputtering as well as a coating interlayer insulating film. The coating interlayer insulating film refers to an interlayer insulating film formed by coating a liquid composition. The coating interlayer insulating film includes organic resin such as acrylic and polyimide, what is called a coating silicon oxide film formed by coating an insulating film material containing silicon dissolved in an organic solvent and performing heat treatment thereto so as to obtain the coating film (Spin on Glass, hereinafter also referred to as "SOG"), a material having siloxane bonds resulting from burning siloxane polymers and the like.

An underetching is performed for the formation of the projection so as to prevent the swelling of the film due to soaking in the peeling agent, and a resist is peeled off in the condition where the conductive film covers the entire surface of the substrate thereafter, which is effective in the invention. Similarly, it is preferable to perform underetching for the formation of the wiring pattern of the upper-layer wiring and a resist is peeled off in the condition where the conductive film covers the entire surface of the substrate thereafter, so as to prevent the interlayer insulating film from being exposed to the resist peeling agent in peeling off the resist after the formation of the upper-layer wiring. After peeling off the resist, additional etching is performed to complete the wiring pattern. Note that a silicon oxide film or the like is formed over a barrier layer to serve as a hard mask in the case where it is difficult to form the top layer of the upper-layer wiring with a conductive barrier layer so as to prevent the wiring pattern from being damaged in the additional etching. When using a hard mask, only a part of the hard mask that is located in a projection of the upper-layer wiring is removed in the formation steps of the projection.

Description is made heretofore on the primary part of the invention. According to the invention, a semiconductor device comprising semiconductor elements and a plurality wirings for connecting the semiconductor elements can be fabricated.

In the invention, a semiconductor element refers to an electronic component including a semiconductor film at least in a part thereof. Specifically, it refers to a transistor formed over/inside a single crystalline semiconductor substrate, a thin film transistor (hereinafter also referred to as a "TFT") formed over an insulating surface, a capacitor having an electrode at least a part of which is formed of a semiconductor thin film, and the like. In the case where there are a plurality of wiring layers for connecting semiconductor elements, the wirings are distinguished as the first wiring, the second wiring, and the like for convenience. Alternatively, wirings formed through an interlayer insulating film are distinguished as the lower-layer wiring and the upper-layer wiring respectively, however, neither of them limit the top-bottom relationship or the manufacture order in the strict sense.

According to the invention, no contact hole with high aspect ratio is required by forming the lower-layer wiring including a projection. Therefore, even when a highly fine microfabrication is required, it is not necessary to develop the contact hole filling techniques using a conductive film or an insulating film such as a high-level optical exposure technique or a high-level etching technique, which can facilitate the formation of a multi-layer wiring structure.

In addition, according to the invention, a step for forming a thick deposition of a conductive film at a time is not required, therefore, fine pattern formation can be achieved without causing a projecting pattern called an alignment marker that is formed in the lower layer in the photolithography step to be buried, which would otherwise lead to the lower accuracy of the alignment of a photomask. Thus, a multi-layer wiring structure can be obtained easily.

Further, by applying the slimming technique of a resist to the formation of a projection, pattern formation can be achieved with a higher resolution than the resolution limit.

According to the structure of the invention described above, by providing a projection in the lower-layer wiring and burying the projection with an interlayer insulating film to obtain an electrical connection between the lower-layer wiring and the upper-layer wiring, an increase in contact resistance can be prevented while realizing a highly-reliable multi-layer wiring structure even when microfabrication is promoted.

BRIEF DESCRIPTION OF THE DRAWINGS

FIGS. 9A and 9B are cross-sectional diagrams illustrating the structure of a light emitting element that can be combined with a multi-layer wiring structure in accordance with the invention.

FIGS. 10A and 10B are cross-sectional diagrams illustrating the structure of a light emitting element that can be combined with a multi-layer wiring structure in accordance with the invention.

DETAILED DESCRIPTION OF THE INVENTION

Figure 1A:
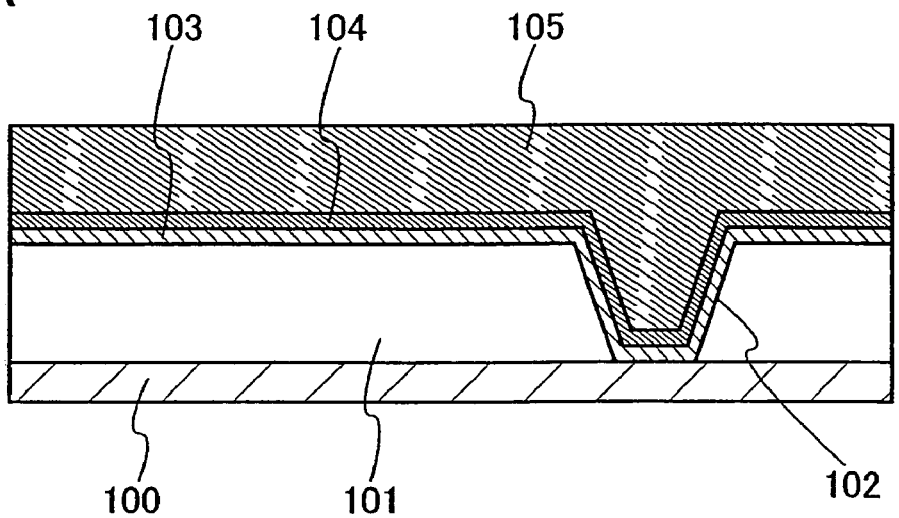
FIGS. 1A to 1C are cross-sectional diagrams showing a manufacturing method of a semiconductor device having a multi-layer wiring structure in accordance with the invention.

According to the invention, in order to obtain an electrical connection between the lower-layer wiring and the upper-layer wiring that are formed to sandwich an interlayer insulating film (interlayer insulating layer), a projection is formed by utilizing conductive films (conductive layers) forming the lower-layer wiring, whereby a similar function to a plug that is used in the buried contact in a semiconductor integrated circuit is realized. That is, by utilizing at least one of the conductive films forming the lower-layer wiring and performing etching thereto so as to obtain a columnar conductive member, and forming the lower-layer wiring including the columnar conductive member to be buried in an interlayer insulating film and to be exposed so as to be connected to the upper-layer wiring, a multi-layer wiring structure is obtained.

The columnar conductive member is formed by etching a thick conductive film so that the projection of the lower-layer wiring can be connected to the upper-layer wiring through the interlayer insulating film. In this case, a residue resulting from the etching may remain due to variations in the thickness of the conductive film or the etching rate, however, since the subsequent etching for forming another wiring may remove the residue, the residue resulting from the etching on this stage is not a fatal problem, and etching can be finished in the condition of underetching. Therefore, the etching step for forming the columnar conductive member can be easily carried out without the need of an etching stopper.

In the case of forming the interlayer insulating film using an inorganic material, the projection is required to be exposed by selectively removing the interlayer insulating film. For example, when using a silicon oxide film deposited by vapor phase growth as an interlayer insulating film, the projection can be exposed by performing an etch back to a resist utilizing the interlayer insulating film over the projection shaped in a projecting manner reflecting the depression/projection of the lower layer. Specifically, the interlayer insulating film may be etched after coating resist and only the interlayer insulating film over the projection is exposed from the resist by performing an etch back all over the resist. Subsequently, by peeling off the resist, the condition in which the projection is exposed in the depression formed in the interlayer insulating film can be obtained.

As for an alternative method, a method for grinding an interlayer insulating film by CMP (Chemical Mechanical Polishing), and subsequently performing an etch back all over the interlayer insulating film can be adopted to obtain the structure in which a part of the projection of the lower-layer wiring is exposed.

In the case of forming the interlayer insulating film by spin coating, formation and planarization of the interlayer insulating film can be performed at the same time, therefore, an etch back can be easily performed all over the interlayer insulating film until the projection is exposed from the interlayer insulating film. The spin coating can be performed by using an SOG material, an inorganic siloxane-based material containing silicon, oxygen or hydrogen and having Si—O—Si bonds, an organic siloxan-based material in which hydrogen is replaced by an organic group such as a methyl or a phenyl group, or an organic polysiloxane-based material having long bonds like (—Si—O—Si—O—).

In addition, in the case of forming the interlayer insulating film using a negative photosensitive material such as polyimide, the projection can be formed by wet etching using a developing solution, which does not require dry etching for an overall etch back. Therefore, plasma damage can be reduced.

In the case of using a coating interlayer insulating film as an interlayer insulating film, the interlayer insulating film is preferably not exposed to a resist peeling agent. Hereupon, the application of the invention allows omission of the etching steps for forming a contact hole. Even in the case of forming a wiring over the interlayer insulating film, an underetching may be employed intentionally so as to form a projection, and then a resist may be peeled off in the condition where the conductive film covers the entire surface of the substrate.

It is preferable that a material for the top layer of the upper-layer wiring and a film thickness thereof are optimized in advance so as to prevent the wiring pattern from being damaged in an additional etching. When it is difficult to form the top layer of the upper-layer wiring using a conductive barrier layer, an insulating film such as a silicon oxide film may be formed as a hard mask over a barrier layer. When using the hard mask, only the hard mask that is over the projection of the wiring to be exposed is only required to be removed in the steps for exposing the projection.

By using the aforementioned method, the invention can be applied to the case even where the interlayer insulating film is formed of an inorganic material or where the interlayer insulating film is formed by spin coating.

The invention can also be applied to a wiring including a projection that is formed over an interlayer insulating film, and in contact with a semiconductor film (semiconductor layer) in the lower layer than the interlayer insulating film. First, a contact hole is formed in an interlayer insulating film that covers a semiconductor film. Then, the first barrier layer is formed over the interlayer insulating film and the contact hole forming portion so that a columnar conductive member is formed in the similar manner to the aforementioned. When forming the columnar conductive member, a depression formed due to the contact hole can be filled in by forming the first conductive film over the first barrier layer.

That is, the contact hole can be filled in by depositing the first conductive film, etching the first conductive film under the condition of underetching for filling in the contact hole and forming a columnar conductive member, thereby leaving the conductive film in the contact hole. Then, the first conductive film forming the columnar conductive member becomes inevitably thick. Further, since the second conductive film is deposited to form a wiring, the conductive films for filling in the contact hole becomes totally thick, and thus the depression can be filled in easily.

As a measure against the case where it is difficult to fill in the contact hole only by the thickening of the conductive film, reflow processing can be used in combination. In this case, the first conductive film is desirably a material that can be applied with reflow processing at as low a temperature as possible, and if an Al—Cu-based alloy is employed, the reflow processing can be performed at temperatures of 400 to 500° C. Meanwhile, as for a conductive film for forming a portion to be led out as a wiring, a material having high stress migration resistance and high electro migration resistance is required so as not to be deteriorated easily. In the invention, the first conductive material for filling in the contact hole and the second conductive film to be led out as a wiring can be used separately, which can help to solve such a problem.

The invention can be applied not only to a multi-layer wiring structure of a semiconductor integrated circuit but also to a display device constructed by connecting a plurality of semiconductor elements with wirings. For example, in a liquid crystal display device having a pixel in which a pixel electrode is connected to a switching element via a contact hole formed in a planarization film, steps that are formed due to the contact hole cause irregular orientation of liquid crystals, thereby having adverse effects on the display quality. However, when the invention is applied to the display device, the steps that cause irregular orientation of the liquid crystals can be drastically reduced, leading to an improved display quality.

Further, the invention can be effectively applied to an EL display device having pixels each including a light emitting element having a pair of electrodes and an organic compound which can exhibit electroluminescence (hereinafter also referred to as "EL") sandwiched therebetween, wherein one of the electrodes is connected to a switching element via a contact hole formed in a planarization film. That is, although a contact hole and the periphery thereof cannot be a light emitting region since the electrode in the region near the contact hole and the periphery thereof does not have a plane surface, the invention can be effectively applied to eliminate a depression derived from the contact hole, thereby obtaining a larger light emitting region with an improved opening ratio.

In any event, a similar effect to that in the microfabrication of a contact hole can be obtained.

Embodiments of the invention are described below with reference to the accompanying drawings. Note that portions common or having a similar function are given the identical reference numerals among all the drawings, and will be explained in no more details.

Embodiment 1

Referring to FIG. 1A, a semiconductor film 100 and the first insulating film (insulating layer) 101 are formed in sequence over a substrate having an insulating surface via a base film. As the substrate, a glass substrate containing barium borosilicate glass or alumino borosilicate glass for example, a quartz substrate, a semiconductor substrate over which an insulating film is formed, a metal substrate over which an insulating film is formed, and the like can be used. In addition, a plastic substrate typified by polyethylene terephthalate (PET), polyethylene naphthalate (PEN) and polyether sulfone (PES), or a synthetic resin substrate having flexibility such as acrylic may be used as well.

The semiconductor film 100 is a portion to form a primary part of an active element such as a transistor, and it may be formed of silicon as well as a semiconductor compound such as silicon germanium and gallium arsenide. Further, not only a single crystalline semiconductor but an amorphous, polycrystalline or quasi-crystalline semiconductor and the like can be used. For example, a crystalline semiconductor film provided by forming an amorphous semiconductor film by sputtering, LPCVD or plasma CVD, which is then crystallized with intense light such as laser light can be used.

The first insulating film 101 functions as what is called an interlayer insulating film for separating elements including the semiconductor film 100 from a wiring for commonly connecting the elements. The first insulating film 101 can be formed by using an inorganic material (silicon oxide, silicon nitride, silicon oxynitride and the like), or a photosensitive or non-photosensitive organic material (polyimide, acrylic, polyamide, polyimide amide, resist or benzocyclobutene). Alternatively, a material having a skeletal structure of Si—O bonds and containing as a substituent at least hydrogen or at least one of fluorine, an alkyl group and an aromatic hydrocarbon, that is, an insulating film having siloxane bonds or a laminated structure of the insulating films can be used.

An opening 102 penetrating the first insulating film 101 is what is called a contact hole, which can be formed by performing dry etching or wet etching using a predetermined mask formed of a photoresist.

Over the first insulating film 101, a conductive film 103 for forming an ohmic contact with the semiconductor film 100 (hereinafter also referred to as a "contact layer" for convenience) is formed. The first contact layer 103 formed over the first insulating film 101 is in contact with the semiconductor film 100 in the opening 102. The first contact layer 103 is formed of titanium (Ti), tungsten (W), tantalum (Ta), tantalum nitride (TaN), titanium nitride (TiN), tungsten nitride (WN), tantalum carbide (TaC), titanium carbide (TiC) or other conductive materials that can form an ohmic contact with the semiconductor film 100. For example, a favorable ohmic contact can be obtained when titanium nitride containing 10 to 45 atomic % of nitrogen is in contact with a silicon semiconductor film. In addition, titanium nitride has an effect of suppressing peeling due to a reaction with silicon. Further, the contact layer can be applied to the contact formation with a conductive material that is relatively chemically unstable, such as aluminium and copper.

Subsequently, the first barrier layer 104 and the first conductive film 105 are formed in sequence over the first contact layer 103. The first barrier layer 104 is provided to prevent the material contained in the first conductive film 105 from being diffused to the semiconductor film 100, and can be formed of one or more of tantalum nitride (TaN), titanium nitride (TiN), tungsten nitride (WN), tantalum carbide (TaC), titanium carbide (TiC) and titanium tungsten (TiW). For example, when titanium nitride of a substantially stoichiometric composition is used, diffusion of the material contained in the first conductive film 105 formed of aluminum or a material containing aluminium as its main component can be prevented.

The first conductive film 105 is formed thick enough to fill in the opening 102 and to form a columnar conductive member to be covered with an interlayer insulating film and sandwiched between the lower-layer wiring and the upper-layer wiring. The first conductive film 105 can be formed of tungsten (W), aluminum (Al), copper (Cu) or an alloy or a compound containing one of them as its main component. As a specific alloy, an Al alloy containing Al added with 0.01 to 5 wt % of Sc, Si, Cu, Ti Ge and the like, an Al—Si alloy, an Al—Ti alloy or an Al—Ge alloy for example can be used. In addition, it is preferable to use a material containing an element such as Ge, Sn, Ga, Zn, Pb, In and Sb or to laminate a thin film containing the above element over an Al film in order to improve fluidity by heat treatment and to lower the temperature of the heat treatment that allows the contact hole to be filled in by reflow. When the Al—Ge alloy formed by sputtering is used as the first conductive film 105, reflow processing can be performed by heat treatment at a temperature of 300 to 500° C.

Figure 1B:
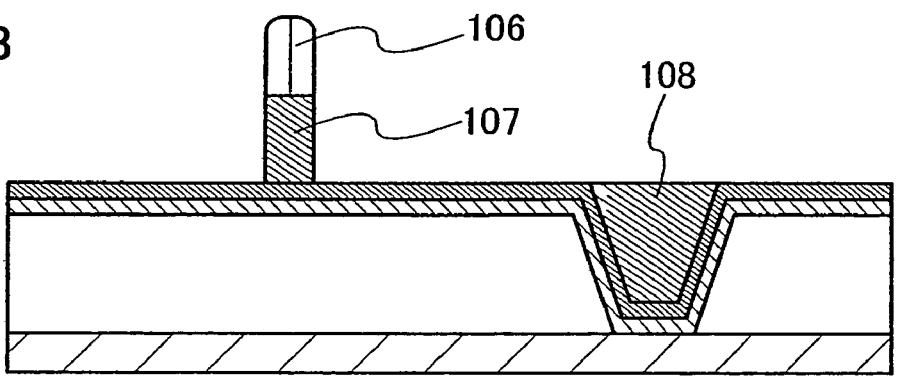

A mask 106 is formed over the first conductive film 105 and etching is performed then so as to form a columnar conductive member 107 and a conductive layer 108 which fills in the contact hole as shown in FIG. 1B. The etching is performed using the first barrier layer 104 as an etching stopper so that the columnar conductive member 107 remains under the mask 106 and the conductive layer 108 filling in the opening 102 forms substantially the same plane as a top surface of the first insulating film 101 or the first barrier layer 104. Note that the columnar conductive member 107 is formed outside of the region where the conductive layer 108 is formed and the contacts with the lower-layer side and the upper-layer side of the first insulating film 101 are formed in different positions from each other.

Figure 1C:
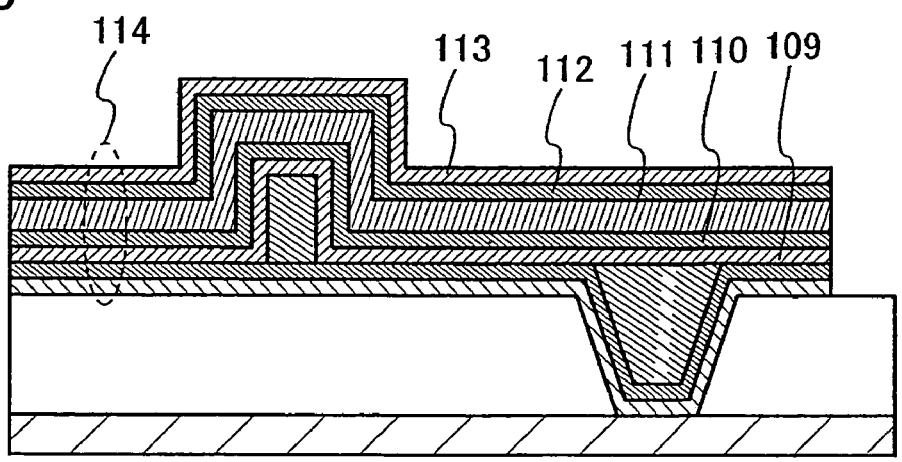

Then, the mask 106 is removed, and the second contact layer 109, the second barrier layer 110 and the second conductive film 111 are formed in sequence so as to cover the columnar conductive member 107 as shown in FIG. 1C. The second contact layer 109 is provided so as to secure a contact with the columnar conductive member 107 and the conductive layer 108 with low contact resistance, and the second barrier layer 110 is provided so as to suppress diffusion of aluminum (Al), copper (Cu), or an alloy or a compound containing one of them as its main component contained in the second conductive film 111 to the periphery such as the side of the semiconductor film. The second conductive film 111 is formed thick enough to cover the columnar conductive member 107 sufficiently, and the third barrier layer 112 and the third contact layer 113 are formed in sequence thereover.

Subsequently, the first contact layer 103, the first barrier layer 104, the second contact layer 109, the second barrier layer 110, the second conductive film 111, the third barrier layer 112 and the third contact layer 113 are etched to form a lower-layer wiring 114 over the first insulating film 101. The lower-layer wiring 114 is formed with a projection due to the columnar conductive member 107.

Figure 2A:
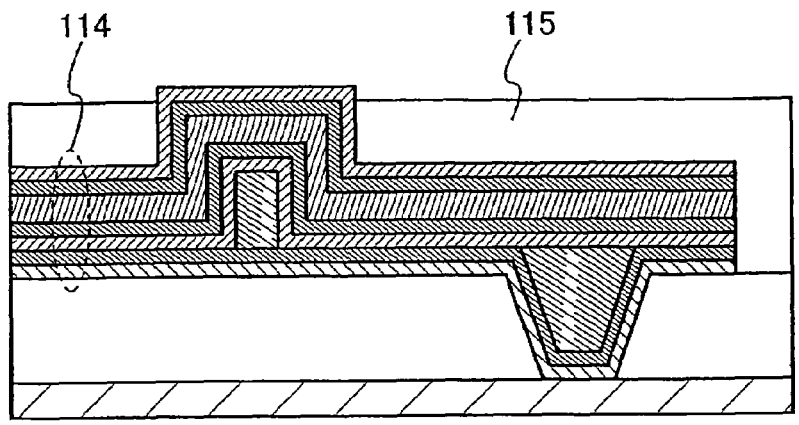
FIGS. 2A to 2C are cross-sectional diagrams showing a manufacturing method of a semiconductor device having a multi-layer wiring structure in accordance with the invention.

By forming the second insulating film 115 to cover the lower-layer wiring 114, and subsequently performing etch back, CMP or the like so as to planarize and recess the surface to expose the projection, the structure as shown in FIG. 2A is obtained.

The second insulating film 115 can be formed by using an inorganic material (silicon oxide, silicon nitride, silicon oxynitride and the like), or a photosensitive or non-photosensitive organic material (polyimide, acrylic, polyamide, polyimide amide, resist or benzocyclobutene). Alternatively, a material having a skeletal structure of Si—O bonds and containing as a substituent at least hydrogen or at least one of fluorine, an alkyl group and an aromatic hydrocarbon, that is, an insulating film having siloxane bonds or a laminated structure of these materials can be used. As for an organic material, positive photosensitive organic resin or negative photosensitive organic resin can be used.

The projection is only required to be exposed to the extent that the projection forms an electrical connection with the upper-layer wiring formed over the second insulating film 115. Thus, the projection may be exposed substantially on the same plane as the top surface of the second insulating film 115 or only a part of the projection may protrude. However, in the case where the steps are planarized by the second insulating film 115, an alignment mark is formed only by the steps formed by the projection, therefore, the steps formed by the projection is required to be high enough for an alignment mark to be detected.

Figure 2B:
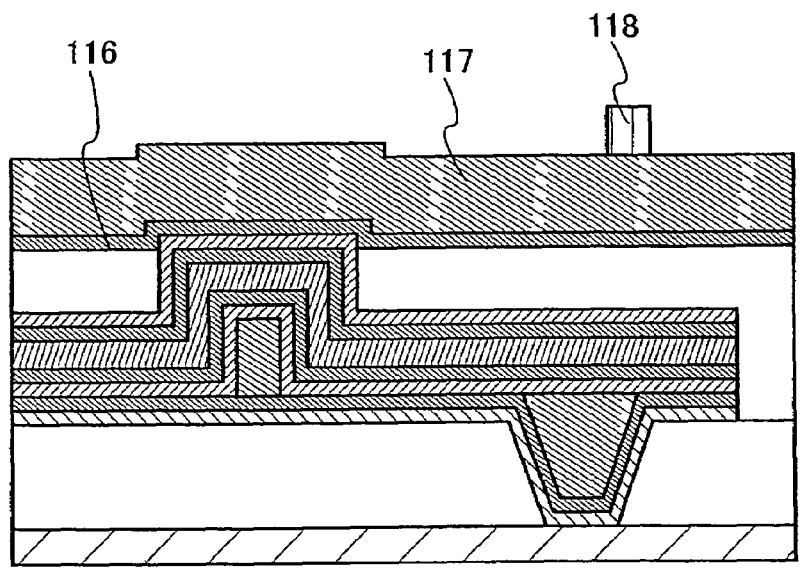

As shown in FIG. 2B, the fourth barrier layer 116 and the third conductive film 117 are formed in sequence so as to have an electrical connection in the projection of the lower-layer wiring 114 that is exposed from the second insulating film 115. These layers can be formed by using the same material as the aforementioned for the sake of the similar objective.

Figure 2C:
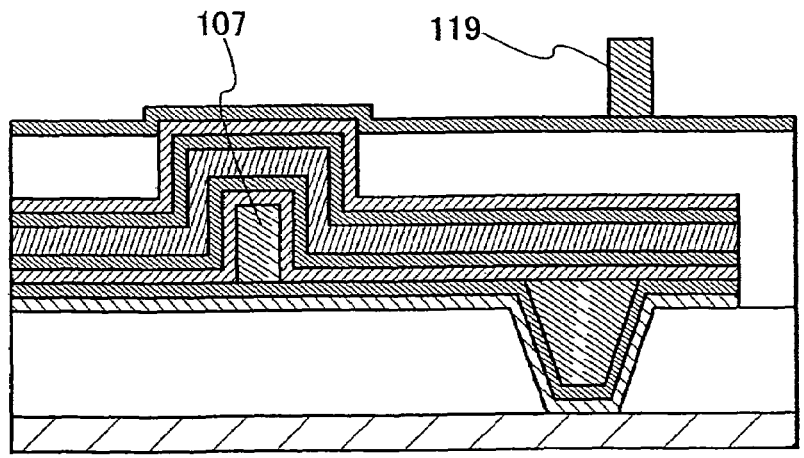

Subsequently, a mask 118 is formed, and the third conductive film 117 is etched to form a columnar conductive member 119 as shown in FIG. 2C. The columnar conductive member 119 is formed so as not to overlap the columnar conductive member 107, however, the columnar conductive member may overlap as well. In this etching, the fourth barrier layer 116 functions as an etching stopper, therefore, the etching can be performed with good selectivity to a base film. Further, by leaving the fourth barrier layer 116 formed over the entire surface, the mask 118 can be peeled off without exposing the second insulating film 115 to the peeling agent. This is effective particularly in the case of forming the second insulating film 115 using an organic resin material.

Figure 3A:
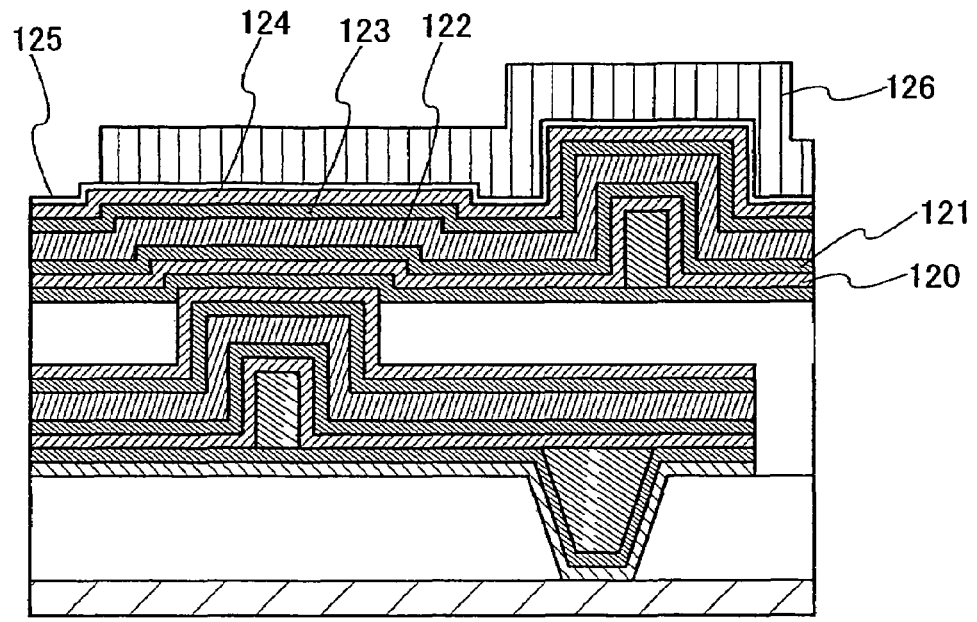
FIGS. 3A and 3B are cross-sectional diagrams showing a manufacturing method of a semiconductor device having a multi-layer wiring structure in accordance with the invention.

Referring to FIG. 3A, the fourth contact layer 120, the fifth barrier layer 121, the fourth conductive film 122, the sixth barrier layer 123, the fifth contact layer 124 and a mask 125 formed of an inorganic material such as silicon oxide (hereinafter also referred to as a "hard mask") are formed in sequence so as to cover the columnar conductive member 107. Then, a mask 126 is formed in order to form the upper-layer wiring with a photoresist.

Figure 3B:
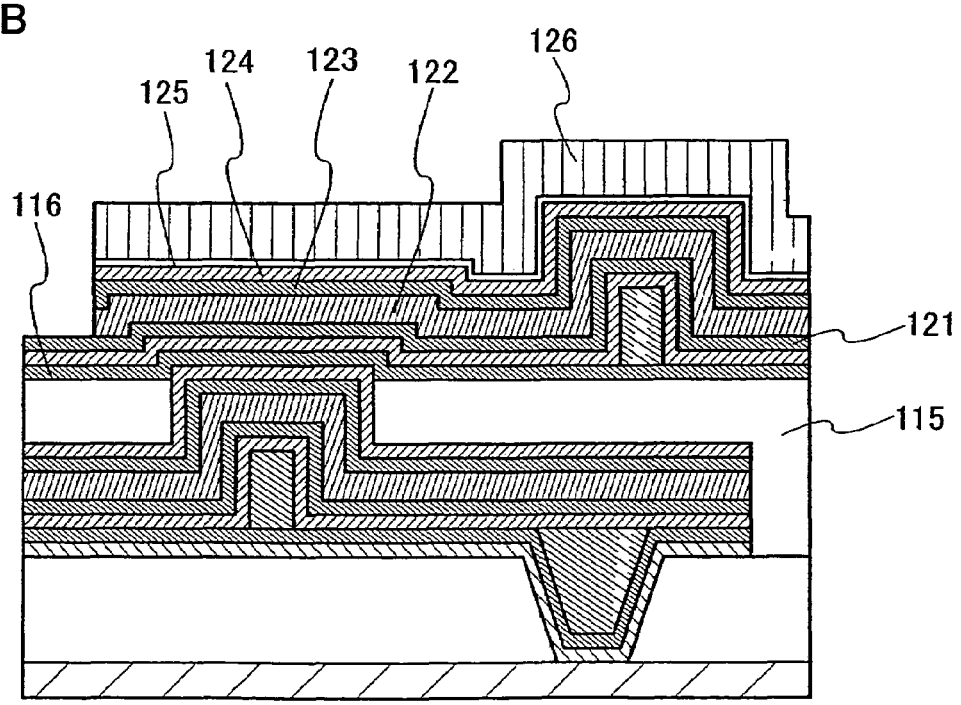

Subsequently, as shown in FIG. 3B, the fourth conductive film 122, the sixth barrier layer 123, the fifth contact layer 124 and the hard mask 125 are removed by etching. In this etching also, the fourth barrier layer 116 and the fifth barrier layer 121 function as etching stoppers as well as passivation films (passivation layers) so as not to expose the second insulating film 115 to the peeling agent in removing the mask 126. In particular, in the case where the second insulating film 115 is formed of an organic resin material, it can be prevented from swelling by being exposed to the peeling agent. That is, the second insulating film 115 is not directly exposed to the peeling agent due to the removal of the mask. Therefore, heat treatment for dehydration or restoration from the swelling due to the exposure to the peeling agent is not required. In addition, the hard mask 125 that is present after the removal of the mask 126 allows the wirings in the lower layers than the fifth contact layer 124 to be protected.

Figure 4:
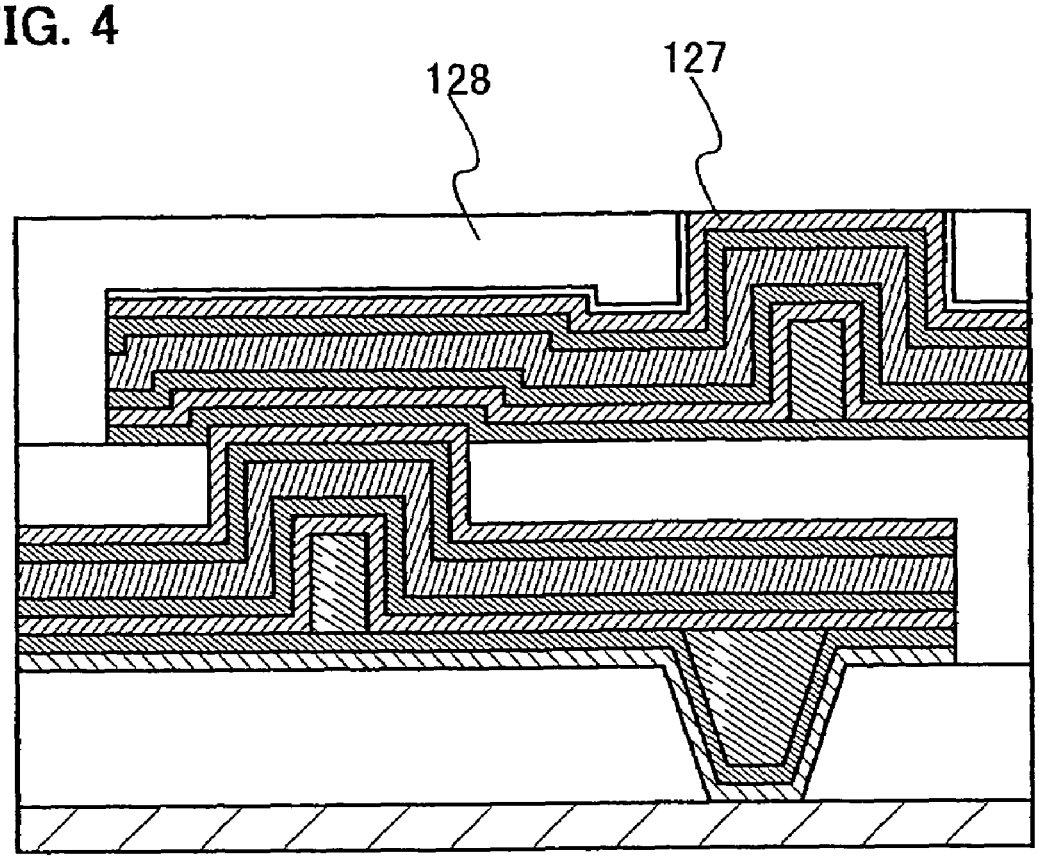
FIG. 4 is a cross-sectional diagram showing a manufacturing method of a semiconductor device having a multi-layer wiring structure in accordance with the invention.

Subsequently, the fourth barrier layer 116, the fourth contact layer 120 and the fifth barrier layer 121 are removed by an etching using the hard mask as a mask as shown in FIG. 4. Then, the third insulating film 128 is formed over the second insulating film and the hard mask. The third insulating film 128 is structured such that the fifth contact layer 124 is exposed by performing etch back, CMP and the like by planarizing and recessing the surface to expose the projection, like the second insulating film 115. The third insulating film 128 can be formed by using an inorganic material (silicon oxide, silicon nitride, silicon oxynitride and the like), or a photosensitive or non-photosensitive organic material (polyimide, acrylic, polyamide, polyimide amide, resist or benzocyclobutene). Alternatively, a material having a skeletal structure of Si—O bonds and containing as a substituent at least hydrogen or at least one of fluorine, an alkyl group and an aromatic hydrocarbon, that is, an insulating film having siloxane bonds, or a laminated structure of these materials can be used. As for an organic material, positive photosensitive organic resin or negative photosensitive organic resin can be used.

Through the repetition of the steps as described above, a multi-layer wiring structure can be obtained. Such a multi-layer wiring structure enables the pattern formation with higher resolution than the resolution limit relatively with ease, therefore, contact holes can be formed with smaller diameters. Further, according to the laminated structure of the wirings, wiring resistance can be reduced. In addition, even in the case where the interlayer insulating film between the lower-layer wiring and the upper-layer wiring is to be formed extremely thick, the use of a wiring with a projection allows an electrical connection between the lower-layer wiring and the upper-layer wiring simply by controlling the height of the projection.

Note that a contact hole is formed in the first insulating film 101 in this embodiment, however, the invention is not limited to this. For example, a multi-layer wiring structure may be formed in which connections of wirings are in such a manner that a lower-layer wiring is electrically connected to an upper-layer wiring via an interlayer insulating film by means of a projection that is formed by utilizing conductive films included in the lower-layer wiring.

Thusly formed multi-layer wiring structure can be applied not only to a semiconductor device including a circuit that is constructed by MOS transistors formed using a semiconductor substrate or TFTs formed over an insulating surface, but also to a pixel portion and a driver circuit portion in a liquid crystal display device, a light emitting device having a light emitting element in each pixel, a DMD (Digital Micro mirror Device), a PDP (Plasma Display Panel), an FED (Field Emission Display) and the like.

Embodiment 2

In this embodiment, an example of a light emitting device having a wiring structure in accordance with the invention is described with reference to the drawings. Described in this embodiment is a light emitting device of which light emitting elements are controlled by TFTs. In particular, the case where the invention is applied to a wiring for connecting the TFT and the light emitting element is described.

Figure 5:
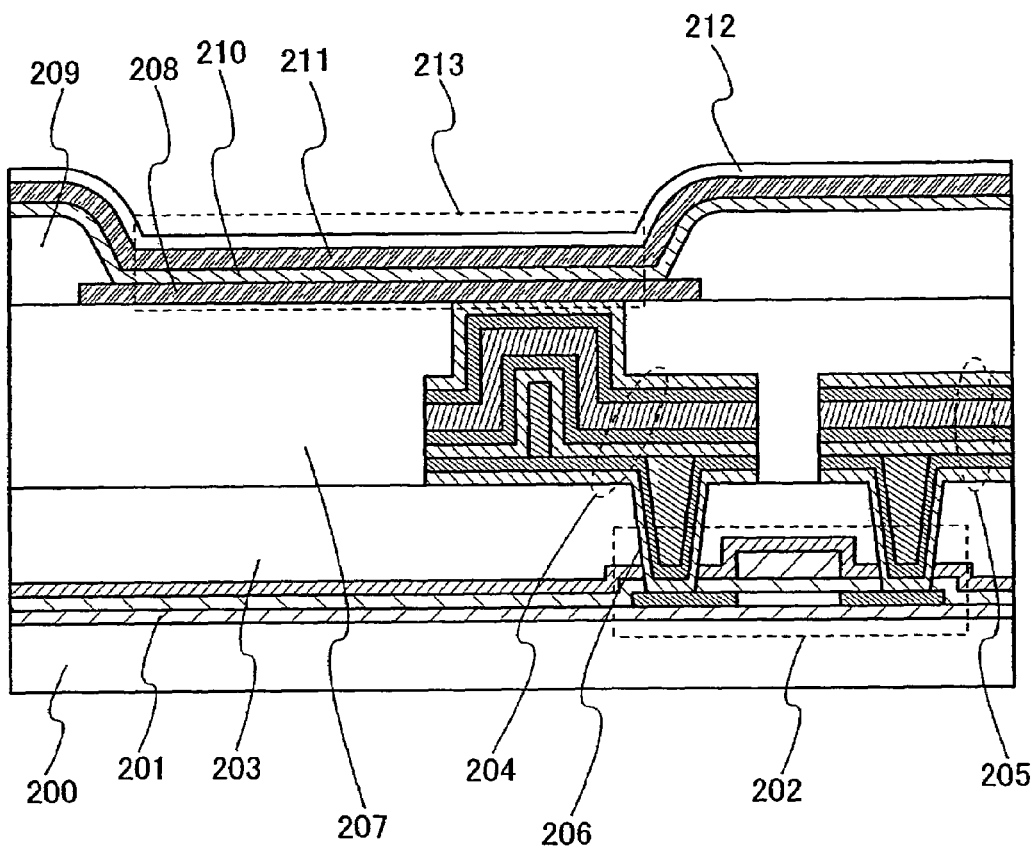
FIG. 5 is a cross-sectional diagram showing a light emitting device having a multi-layer wiring structure in accordance with the invention.

Referring to FIG. 5, a TFT 202, the first insulating film 203 and wirings 204 and 205 are formed over a substrate 200 over which an insulating film 201 is formed. The wirings 204 and 205 are each connected to a one-conductivity type impurity region forming a source or drain region of the TFT 202 via an opening (contact hole) 206 formed in the first insulating film 203. As in Embodiment 1, the wirings 204 and 205 each include the first contact layer 103, the first barrier layer 104, the columnar conductive member 107 and the conductive layer 108, the second contact layer 109, the second barrier layer 110, the second conductive film 111, the third barrier layer 112 and the third contact layer 113.

The second insulating film 207 is formed so as to bury the wirings 204 and 205 and to expose the top of the projection of the wiring 204 substantially on the same plane as the top surface of itself. Alternatively, the projection may be exposed, after forming the second insulating film 207, with planarizing the second insulating film 207 by removing the surface layer thereof by CMP or etch back.

Over the second insulating film 207, the first electrode 208 is formed to be in contact with the exposed projection of the wiring 204. The first electrode 208 functions as one of the electrodes of a light emitting element. By forming such a connection structure, the first electrode 208 can be formed over the plane surface, leading to the increased usable area of the light emitting element.

Subsequently, the third insulating film 209 is formed so as to cover the first electrode 208. An opening in the insulating film 209 is formed on the first electrode 208. An EL layer 210 is formed then to be in contact with the first electrode 208. Over the EL layer 210, the second electrode 211 is formed and a light emitting element is formed in the area where the EL layer 210 and the second electrode 211 are overlapped with the first electrode 208. The third insulating film 209 separates adjacent light emitting elements by covering the edges of the first electrode 208 and thereby preventing short-circuits in the portion.

The EL layer 210 has a lamination of a hole transporting layer, a light emitting layer and an electron transporting layer in the light of the carrier transporting characteristics. A hole injection layer may be provided between a hole injection electrode and the hole transporting layer, or an electron injection layer may be provided between an electron injection electrode and the electron transporting layer. There is not necessarily distinction between the hole injection layer and the hole transporting layer, or between the electron injection layer and the electron transporting layer in the strict sense, and they are the same in that hole transporting characteristics (hole mobility) and electron transporting characteristics (electron mobility) are of the significant characteristics. Alternatively, a hole blocking layer may be provided between the electron transporting layer and the light emitting layer. The color of the light emitting layer may be changed by doping a guest material such as pigment or metal complex to a host material. That is, the light emitting layer may contain a fluorescent material or a phosphorescent material. In some cases, the light emitting element serves also as an electron transporting layer, and it is referred to as a light emissive electron transporting layer.

As an example of the EL layer 210, the following materials can be used: CuPc or PEDOT as the hole injection layer, á-NPD as the hole transporting layer, BCP or Alq$_3$ as the electron transporting layer, and BCP:Li or CaF$_2$ as the electron injection layer. As for the light emitting layer, Alq$_3$ that is doped with dopant corresponding to each emission color of red, green and blue (DCM and the like for the red color, and DMQD and the like for the green color) may be used.

The EL layer may be formed not only of an organic compound but also of a material formed by combining an organic material and an inorganic material, a material formed by an organic compound doped with a metal complex or the like as far as the similar function to that of the organic compound can be implemented. For example, a composite material formed by coevaporating oxide such as molybdenum oxide (MoOx: x=2 to 3) and á-NPD or rubrene to the hole injection layer can be used.

It is needless to mention that the structure of the layers for exhibiting EL may be changed, and such change can be made so that no specific hole injection layer or electron transporting layer is provided, but another electrode for transporting holes or electrons may be provided instead or a material by which the effect of transporting holes or electrons may be dispersed within the range of the gist of this embodiment.

In addition, when performing multi-color display, display with high color purity can be performed by additionally providing a color filter or a color conversion layer corresponding to each pixel.

The materials of the first electrode 208 and the second electrode 211 are selected so that one of the first electrode 208 and the second electrode 211 can function as an electrode (anode) to which holes are injected (hereinafter also referred to as a "hole injection electrode") and the other can function as an electrode (cathode) to which electrons are injected (hereinafter also referred to as an "electron injection electrode").

The first electrode 208 (hole injection electrode) is preferably formed of a metal, an alloy or an electrically conductive compound each having a large work function (work function of 4.0 eV or more), or a mixture of such materials. Specifically, used as such materials are ITO (Indium Tin Oxide), IZO (Indium Zinc Oxide), which contains indium oxide mixed with 2 to 20% of zinc oxide (ZnO), a material obtained by mixing indium oxide with 2 to 20% of silicon oxide (SiO$_2$), gold (Au), platinum (Pt), nickel (Ni), tungsten (W), chrome (Cr), molybdenum (Mo), which is referred to as ITSO, iron (Fe), cobalt (Co), copper (Cu), palladium (Pd), a nitride of a metal material (TiN) and the like.

The second electrode (electron injection electrode) 211 is preferably formed of a metal, an alloy or an electrically conductive compound each having a small work function (work function of 3.8 eV or less), or a mixture of these materials. Specifically, an element that belongs to the first group or the second group in the periodic table, that is an alkaline metal such as Li and Cs, an alkaline earth metal such as Mg, Ca and Sr, an alloy containing them (Mg:Ag, Al:Li) or a compound containing them (LiF, CsF, CaF$_2$) as well as transition metals containing rare earth metals can be used. Alternatively, the second electrode 211 may be formed by a lamination of an extremely thin layer of such metals or an alloy containing them, and a layer of ITO, IZO, ITSO or other metals (including an alloy).

In this manner, the light emitting element 213 is formed to have a structure in which the EL layer 210 is sandwiched between the first electrode 208 and the second electrode 211.

It is needless to mention that the first electrode functioning as a hole injection electrode and the second electrode functioning as an electron injection electrode are both related to the EL layer, therefore, it is possible that the first electrode is formed as an electron injection electrode and the second electrode is formed as a hole injection electrode by using the above-described materials according to the laminated structure of the EL layer.

A passivation film 212 may be formed over the second electrode 211. The passivation film 212 is formed of an insulating material such as silicon nitride formed by plasma CVD or sputtering. It is needless to mention that the passivation film 212 may be formed of other materials as long as it has a function of blocking out extrinsic impurities such as water vapor. For example, carbon nitride, diamond-like carbon and the like can be used. Alternatively, a multi-layer structure can be used in which barrier insulating films and hygroscopic insulating films are alternately laminated in order to increase the gas barrier properties and decrease the effect of stress of the passivation film.

In this manner, a light emitting device can be obtained in which a wiring having a projection formed by burying a columnar conductive member therein is used for the connection between the TFT 202 and the light emitting element 213.

Figure 6:
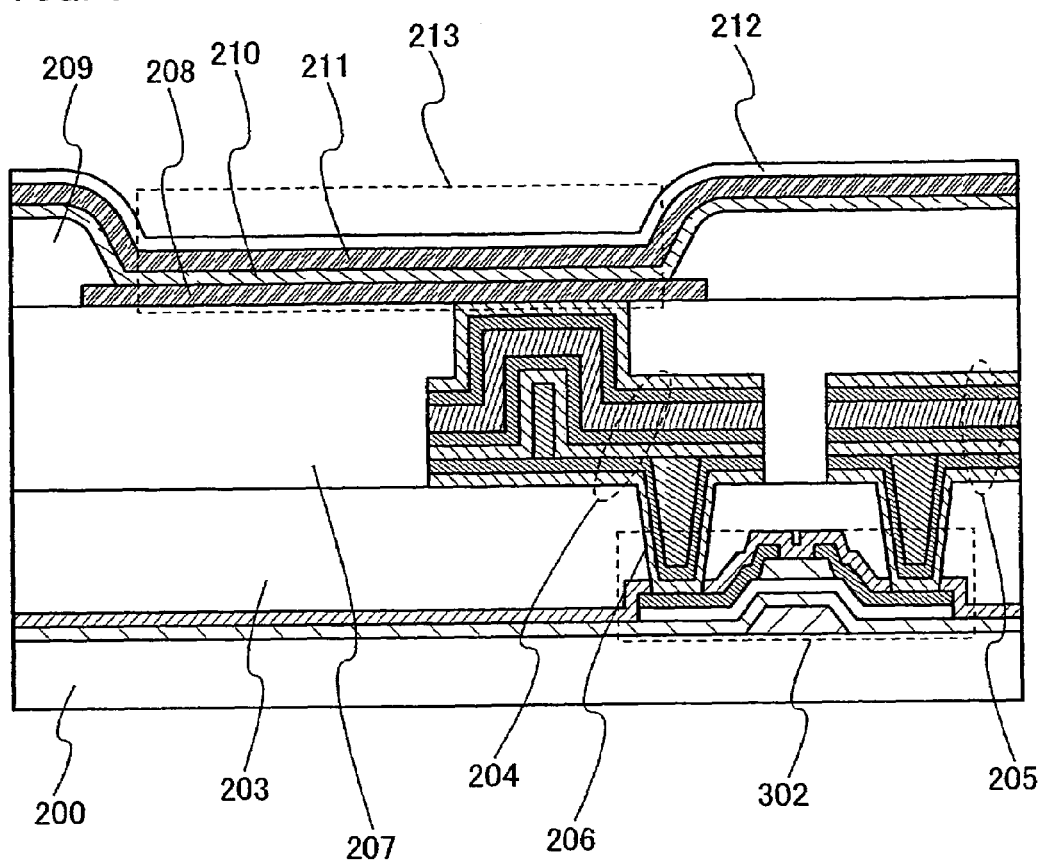
FIG. 6 is a cross-sectional diagram showing a light emitting device having a multi-layer wiring structure in accordance with the invention.

Similarly, FIG. 6 illustrates an example of a light emitting device in which a wiring having a projection formed by burying a columnar conductive member therein is used for the connection between an inversely staggered TFT 302 and the light emitting element 213. The inversely staggered TFT 302 has a sequential lamination of a gate electrode, a gate insulating film, a semiconductor film including a channel forming region, a source region and a drain region. The wirings 204 and 205 are connected to the inversely staggered TFT 302 via the contact hole 206 formed in the first insulating film 203. This connection structure is similar to that shown in FIG. 5.

Note that described in this embodiment is the example where a multi-layer wiring structure in accordance with the invention is applied to the connection structure of a TFT and one of the electrodes of a light emitting element via the first insulating film, however, the invention is not limited to this and a light emitting device having a structure in which the lower-layer wiring and the upper-layer wiring are electrically connected to each other via a plurality of insulating layers can be used as well.

Embodiment 3

FIGS. 9A to 12B each illustrate a detailed diagram showing a structure of the light emitting element shown in Embodiment 2. By applying a light emitting element described below to the light emitting element in Embodiment 2, a light emitting device can be constructed.

FIG. 9A illustrates an exemplary structure in which the first electrode 11 is formed of a light transmissive conductive oxide material such as ITO or the one containing silicon oxide. Over the first electrode 11, an EL layer 16 having a lamination of a hole transporting/injection layer 41, a light emitting layer 42 and an electron injection/transporting layer 43 is formed. The second electrode 17 over the EL layer 16 includes the third electrode layer 33 formed of an alkaline metal such as LiF and MgAg or an alkaline earth metal, and the fourth electrode layer 34 formed of a metal material such as aluminium. A pixel having such a structure can emit light from the first electrode 11 as shown by an arrow.

FIG. 9B illustrates an exemplary structure in which light is emitted from the second electrode 17. The first electrode 11 includes the first electrode layer 35 formed of a metal such as aluminium and titanium or a metal material containing both the metal and nitrogen with a concentration of stoichiometric composition or less, and the second electrode layer 32 formed of a conductive oxide material containing silicon oxide with a concentration of 1 to 15 atom %. Over the first electrode 11, the EL layer 16 having a lamination of the hole transporting/injection layer 41, the light emitting layer 42 and the electron injection/transporting layer 43 is formed. The second electrode 17 formed over the EL layer 16 includes the third electrode layer 33 formed of an alkaline metal such as LiF and CaF and an alkaline earth metal, and the fourth electrode layer 34 formed of a metal material such as aluminium. By forming each layer to have a thickness of 100 nm or less so as to transmit light, light can be emitted from the second electrode 17 as shown by an arrow.

FIG. 10A illustrates an exemplary structure in which light is emitted from the first electrode 11 and the EL layer 16 has a sequential lamination of the electron injection/transporting layer 43, the light emitting layer 42 and the hole transporting/injection layer 41. The second electrode 17 includes the second electrode layer 32 formed of a conductive oxide material containing silicon oxide with a concentration of 1 to 15 atom %, and the first electrode layer 35 formed of a metal such as aluminium and titanium or a metal material containing both the metal and nitrogen with a concentration of stoichiometric composition or less. The first electrode 11 includes the third electrode layer 33 formed of an alkaline metal such as LiF and CaF or an alkaline earth metal, and the fourth electrode layer 34 formed of a metal material such as aluminium. By forming each layer to have a thickness of 100 nm or less so as to transmit light, light can be emitted from the first electrode 11 as shown by an arrow.

FIG. 10B illustrates an exemplary structure in which light is emitted from the second electrode 17 and the EL layer 16 has a sequential lamination of the electron injection/transporting layer 43, the light emitting layer 42 and the hole transporting/injection layer 41. The first electrode 11 has a similar structure to that of FIG. 10A, and has a thickness enough to allow the light emitted from the EL layer 16 to be reflected. The second electrode 17 is formed of a conductive oxide material such as ITO and the one containing silicon oxide. In this structure, by forming the hole injection layer with an inorganic metal oxide (typically, molybdenum oxide or vanadium oxide), oxygen that is introduced in the formation of the second electrode layer 32 can be supplied thereto, which improves hole injection properties and lowers a drive voltage.

FIGS. 11A to 12B each illustrate a pixel having a structure in which light is emitted from both sides of the first electrode 11 and the second electrode 17.

Figure 11A:
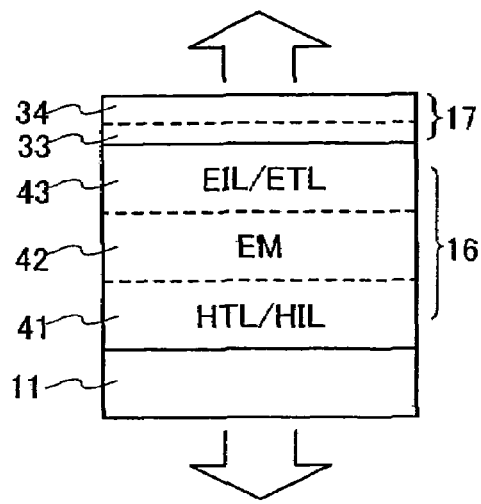
FIGS. 11A and 11B are cross-sectional diagrams illustrating the structure of a light emitting element that can be combined with a multi-layer wiring structure in accordance with the invention.

FIG. 11A illustrates an exemplary structure in which the first electrode 11 is formed of a light transmissive conductive oxide material such as ITO or the one containing silicon oxide. Over the first electrode 11, the EL layer 16 having a lamination of the hole transporting/injection layer 41, the light emitting layer 42 and the electron injection/transporting layer 43 is formed. The second electrode 17 formed over the EL layer 16 includes the third electrode layer 33 formed of an alkaline metal such as LiF and CaF or an alkaline earth metal, and the fourth electrode layer 34 formed of a metal material such as aluminium. By forming each layer to have a thickness of 100 nm or less so as to transmit light, light can be emitted from both sides of the second electrode 17 and the first electrode 11.

Figure 11B:
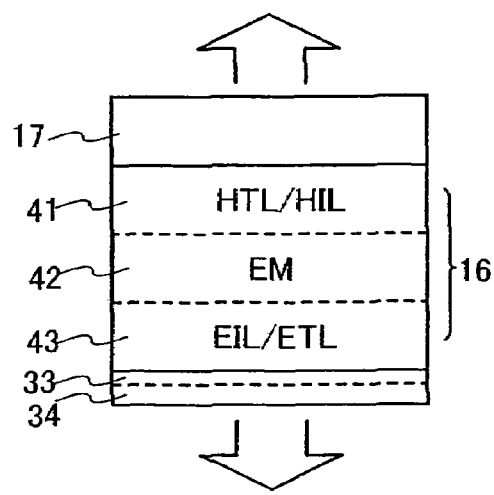

In FIG. 11B, the first electrode 11 includes the third electrode layer 33 formed of an alkaline metal such as LiF and CaF or an alkaline earth metal, and the fourth electrode layer 34 formed of a metal material such as aluminium, each of which layers is formed to have a thickness of 100 nm or less so as to transmit light. Over the first electrode 11, the EL layer 16 having a sequential lamination of the electron injection/transporting layer 43, the light emitting layer 42 and the hole transporting/injection layer 41 is formed. The second electrode 17 formed over the EL layer 16 is formed of a conductive oxide material such as ITO or the one containing silicon oxide. According to such a structure, light can be emitted from both sides of the second electrode 17 and the first electrode 11.

Figure 12A:
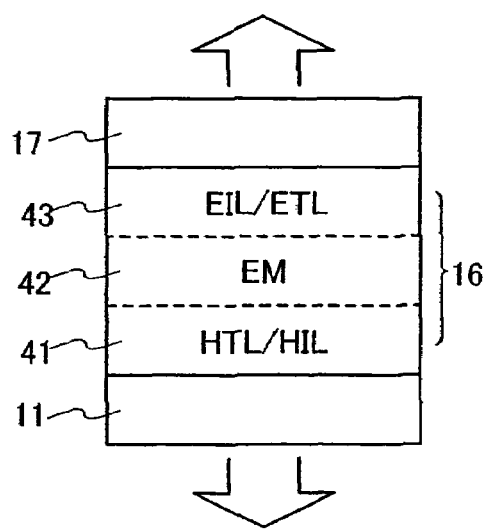
FIGS. 12A and 12B are cross-sectional diagrams illustrating the structure of a light emitting element that can be combined with a multi-layer wiring structure in accordance with the invention.
Figure 12B:
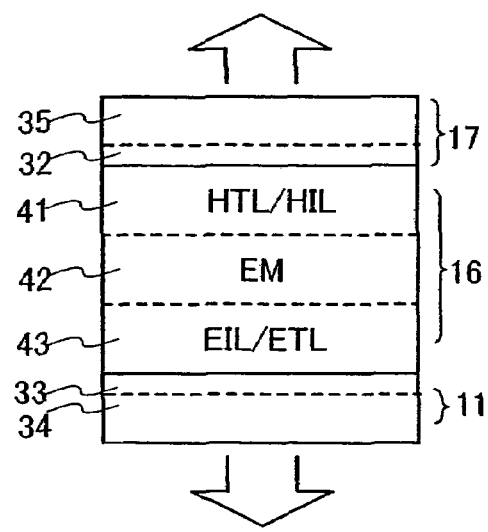

FIGS. 12A and 12B each illustrate an exemplary structure in which the first electrode 11 and the second electrode 17 are formed of the similar materials. That is, both of the first electrode 11 and the second electrode 17 are formed of a conductive oxide material such as ITO or the one containing silicon oxide. It is preferable that a layer of the hole transporting/injection layer 41 in the EL layer 16 that is closer to the second electrode layer 32 is formed of a metal oxide (typically, molybdenum oxide or vanadium oxide) and a layer of the electron injection/transporting layer 43 that is closer to the third electrode layer 33 is formed of an alkaline metal or an organic material containing an alkaline earth metal (typically, benzoxazole derivatives or pyridine derivatives).

Embodiment 4

In this embodiment, an example of a liquid crystal display device having a wiring structure in accordance with the invention is described with reference to the drawings. The liquid crystal display device described in this embodiment employs TFTs for controlling liquid crystals, and the description is made particularly on the case where the invention is applied to a wiring for connecting the TFTs and electrodes for controlling the orientation of liquid crystals.

Figure 7:
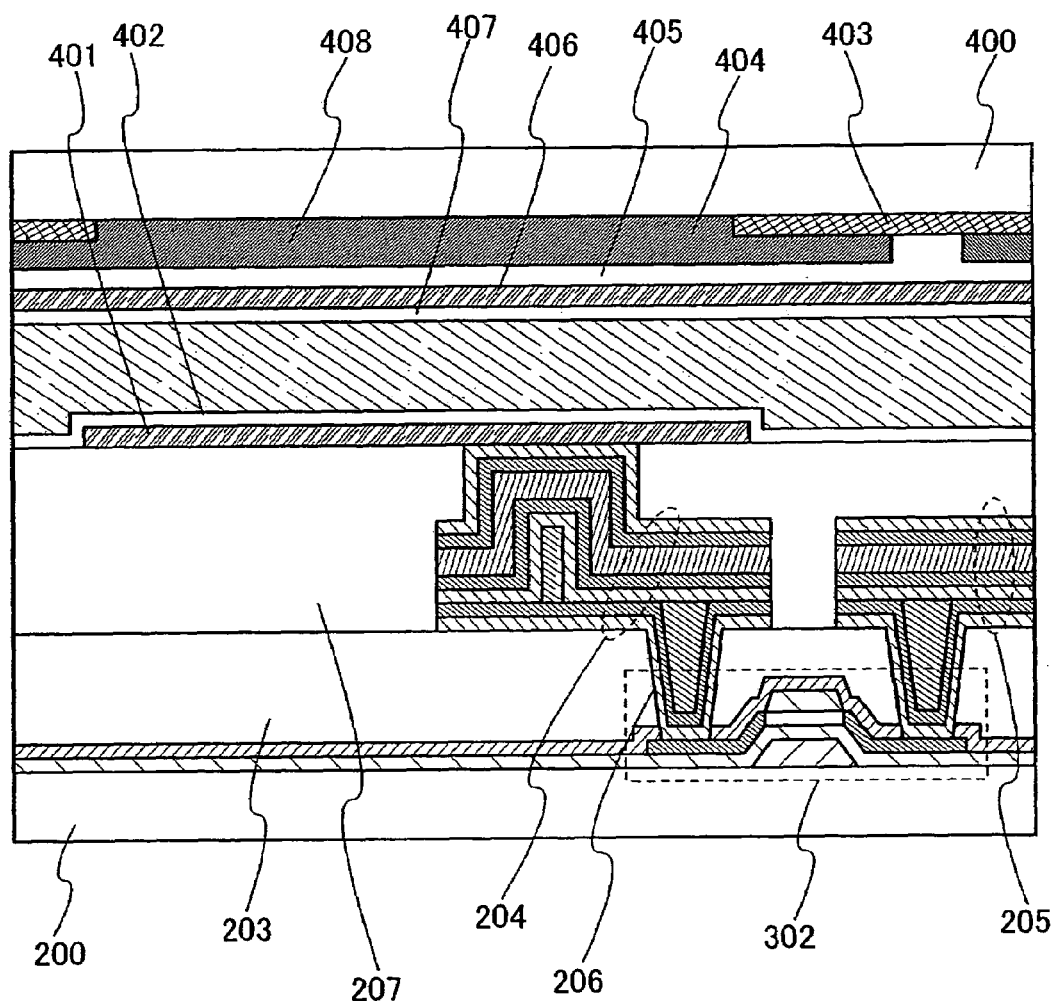
FIG. 7 is a cross-sectional diagram showing a liquid crystal display device having a multi-layer wiring structure in accordance with the invention.

FIG. 7 illustrates an example where the inverted staggered TFT 302, the first insulating film 203 and the wirings 204 and 205 are formed over the substrate 200. The wirings 204 and 205 are each connected to a one-conductivity type impurity region forming a source or drain region of the TFT 302 via the opening 206 formed in the first insulating film 203. As in Embodiment 2, the wirings 204 and 205 each include the first contact layer 103, the first barrier layer 104, the columnar conductive member 107 and the conductive layer 108, the second contact layer 109, the second barrier layer 110, the second conductive film 111, the third barrier layer 112 and the third contact layer 113.

The second insulating film 207 is formed to fill in the wirings 204 and 205 and to expose the top of the projection of the wiring 204 substantially on the same plane. Alternatively, the projection may be exposed, after the formation of the second insulating film 207, through planarization by performing CMP or etch back to the surface thereof.

Over the second insulating film 207, the first electrode 401 is formed to be in contact with the projection of the wiring 204. The first electrode 401 forms one of the electrodes of the light emitting element, and according to such a connection structure, the first electrode 401 can be formed on the planar surface, leading to the increased usable area of the pixel electrode while preventing disclination.

Over a counter substrate 400, a light-shielding layer 403, a colored layer 404, a planarization layer 405 formed of an acrylic material and the like and a counter electrode 406 are formed in sequence. The counter substrate 400 and the substrate 200 are attached via a spacer (not shown), and a liquid crystal 407 is sealed between them.

when both of the first electrode 401 and the second electrode (corresponds to a counter electrode) 406 are formed of light transmissive conductive films, a light transmissive liquid crystal display device can be fabricated. On the other hand, when one of them is formed of a light reflective film, a light reflective liquid crystal display device can be fabricated. It is needless to mention that a semi-light transmissive liquid crystal display device can be fabricated by forming a window to transmit light in one of the electrodes to serve as a light reflective electrode.

Embodiment 5

The multi-layer wiring structure shown in Embodiment 1 can be applied to a wiring of a semiconductor integrated circuit. The semiconductor integrated circuit includes various integrated circuits such as a memory, various processors and a central processing unit (hereinafter also referred to as a "CPU").

Figure 8:
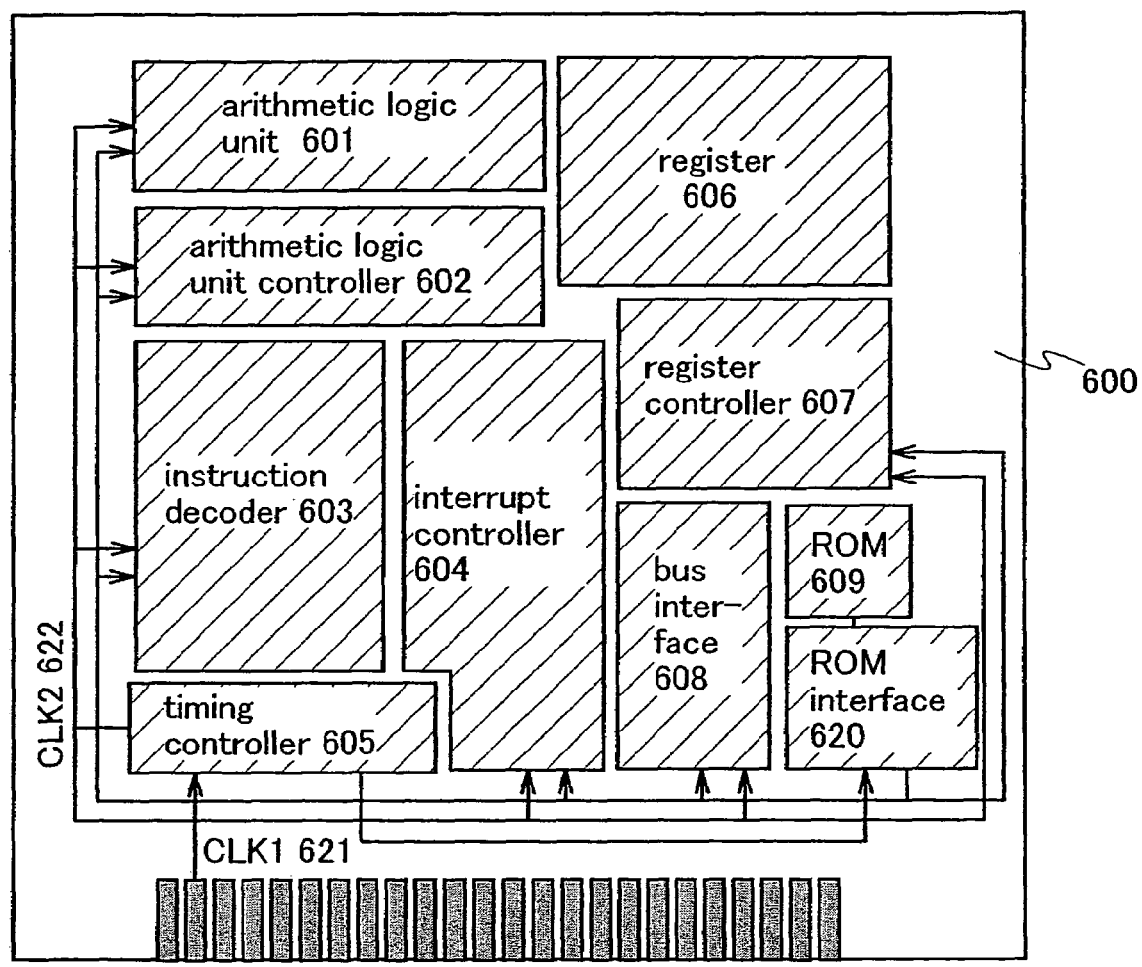
FIG. 8 is a configuration diagram showing a CPU having a multi-layer wiring structure in accordance with the invention.

FIG. 8 illustrates an exemplary configuration of a CPU. Over a substrate 600 formed are an arithmetic logic unit (ALU) 601, an arithmetic logic unit controller (ALU controller) 602, an instruction decoder 603, an interrupt controller 604, a timing controller 605, a register 606, a register controller 607, a bus interface (Bus I/F) 608, a writable ROM 609 and a ROM interface (ROM I/F) 620. The ROM 609 and the ROM interface (ROM I/F) 620 may be formed separately.

An instruction inputted to the CPU via the bus interface 608 is inputted to the instruction decoder 603, and after being decoded, it is inputted to the ALU controller 602, the interrupt controller 604, the register controller 607 and the timing controller 605.

The ALU controller 602, the interrupt controller 604, the register controller 607 and the timing controller 605 each perform control based on the decoded instruction. Specifically, the ALU controller 602 generates signals for controlling the operation of the ALU 601. The interrupt controller 604 processes interrupt request from an external input/output device or a peripheral circuit based on the determination of the priority thereof and the state of a mask during the program execution of the CPU. The register controller 607 generates an address of the register 606 and performs reading/writing of the register 606 according to the state of the CPU.

The timing controller 605 generates signals for controlling the operation timing of the ALU 601, the ALU controller 602, the instruction decoder 603, the interrupt controller 604 and the register controller 607. For example, the timing controller 605 has an internal clock generator for generating an internal clock signal CLK2 (622) based on the reference clock signal CLK1 (621), and it supplies the clock signal CLK2 to the various circuits described above.

It is needless to mention that the CPU shown in FIG. 8 is only an example of the simplified configuration, and a CPU in practice has various configurations according to its application. Such a CPU is packaged to be protected externally, and thus is easily taken along with. Further, when the CPU has flexibility to be mounted on the desired position, the mounting position thereof can be selected with higher flexibility. In addition, due to the packaging, the function of the CPU can be reinforced.

In this manner, the CPU formed with thin film transistors over a glass substrate can have various modes. Further, since the CPU formed with thin film transistors over a glass substrate is lightweight, the load in the mobile use or in mounting can be reduced.

Such a CPU can be formed by using a single crystalline semiconductor substrate as well as a glass substrate with TFTs. In particular, in the case of forming an integrated circuit such as a CPU over a glass substrate, it is more difficult to achieve microfabrication than the case of using a single crystalline semiconductor substrate due to the different planarities of the glass substrate and the single crystal semiconductor substrate. In such a case, by applying a multi-layer wiring structure in accordance with the invention that can perform pattern formation with higher resolution than the resolution limit relatively with ease, instead of the pattern formation of the contact hole, microfabrication of a contact can be achieved. Further, a multi-layer wiring structure in accordance with the invention has another advantage, in addition to the advantage of the microfabrictaion, that multi-layer wirings can have contact with each other easily only by the controlled height of a projection even in the case where the interlayer insulating film is to be formed thick in view of the decreased delay of wirings.

Embodiment 6

Figure 13A:
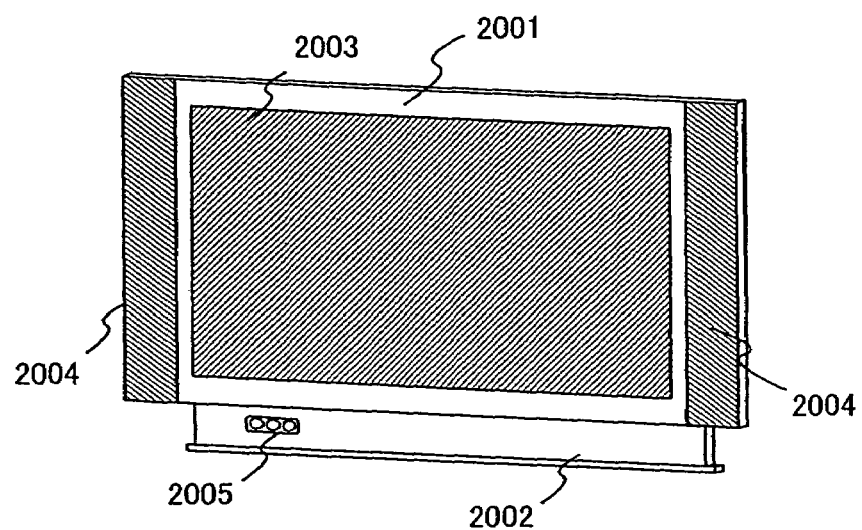
FIGS. 13A to 13C are examples of electronic appliances completed in accordance with the invention such as a television receiving set, a computer and an image reproducing device.
Figure 13B:
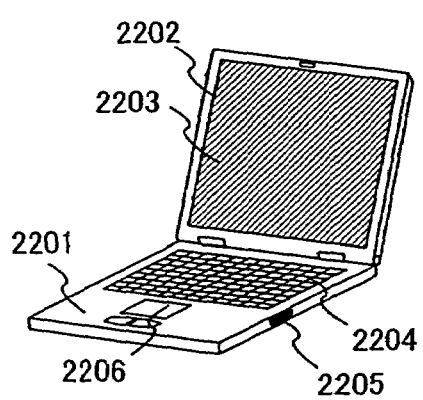
Figure 13C:
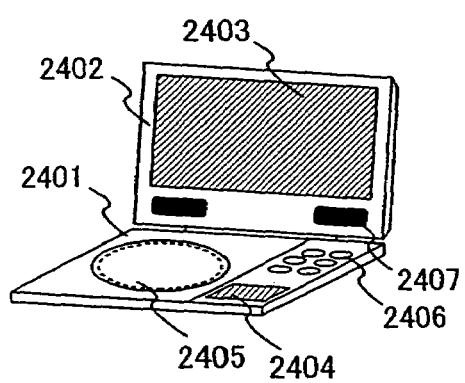

The invention can be applied to electronic appliances such as a television receiving set, a computer and an image reproducing device as illustrated in FIGS. 13A to 13C as well as other electronic appliances.

FIG. 13A illustrates an example of a television receiving set completed in accordance with the invention, which includes a housing 2001, a supporting base 2002, a display portion 2003, a speaker portion 2004, a video input terminal 2005 and the like. By specializing the function of the light emitting device in Embodiment 3 or the liquid crystal display device in Embodiment 4 to be used as a television set for example, high-resolution images can be displayed.

FIG. 13B illustrates an example of a laptop personal computer completed in accordance with the invention, which includes a main body 2201, a housing 2202, a display portion 2203, a keyboard 2204, an external connecting port 2205, a pointing mouse 2206 and the like. For example, the light emitting device in Embodiment 3 or the liquid crystal display device in Embodiment 4 can be applied to the display portion 2203, and Embodiment 5 can be applied to the CPU as a central unit of the personal computer to be provided inexpensively, the integration of which with the aforementioned display device enables the manufacture of a thin laptop personal computer FIG. 13C illustrates an example of an image reproducing device completed in accordance with the invention, which includes a main body 2401, a housing 2402, a display portion A2403, a display portion B2404, a recording medium reading portion 2405, an operating key 2406, a speaker portion 2407 and the like. The light emitting device in Embodiment 3 or the liquid crystal display device in Embodiment 4 can be applied to the display portions A2403 and B2404, and Embodiment 5 can be applied to the CPU to be provided inexpensively, the integration of which with aforementioned display device enables the manufacture of a thin image reproducing device.

What is claimed is:

1. A method for manufacturing a device comprising the steps of:
   forming a first insulating film over a substrate;
   forming a first opening in the first insulating film;
   forming a first conductive film over the first insulating film and in the first opening;
   forming a second conductive film over the first conductive film and in the first opening so as to fill in the first opening;
   etching the second conductive film so as to form a conductive layer in the first opening and a first columnar conductive member on a portion of the second conductive film, the portion being located apart from the first opening;
   forming a third conductive film over the first conductive film, the conductive layer, and the first columnar conductive member, thereby, forming a first projection over the first columnar conductive member;
   forming a second insulating film over the third conductive film; and
   forming a fourth conductive film over the second insulating film and the third conductive film so as to be electrically connected to a top surface of the first projection.

2. The method for manufacturing a device according to claim 1, further comprising:
   etching the fourth conductive film so as to form a second columnar conductive member; and
   forming a fifth conductive film over the fourth conductive film and the second columnar conductive member so as to form a second projection over the second columnar conductive member.

3. The method for manufacturing a device according to claim 1, further comprising:
   forming a transistor over the substrate before forming the first insulating film,
   wherein the first insulating film is formed over the transistor, and
   wherein the first conductive film is electrically connected to the transistor through the first opening in the first insulating film.

4. The method for manufacturing a device according to claim 1, wherein the conductive layer and the first columnar conductive member are formed in different positions from each other.

5. The method for manufacturing a device according to claim 1, wherein the first conductive film is used as an etching stopper.

6. The method for manufacturing a device according to claim 1, wherein the device is one of a memory, a processor and a central processing unit.

7. A method for manufacturing a semiconductor device comprising the steps of:
   forming a first insulating film over a substrate;
   forming a first opening in the first insulating film;
   forming a first conductive film over the first insulating film and in the first opening;
   forming a second conductive film over the first conductive film and in the first opening so as to fill in the first opening;
   etching the second conductive film so as to form a conductive layer in the first opening and a columnar conductive member on a portion of the second conductive film, the portion being located apart from the first opening;
   forming a third conductive film over the first conductive film, the conductive layer, and the columnar conductive member, thereby, forming a projection over the columnar conductive member;
   forming a second insulating film over the third conductive film;
   forming a fourth conductive film over the second insulating film and the third conductive film so as to be electrically connected to a top surface of the projection;
   forming a third insulating film over the second insulating film and the fourth conductive film;
   forming a second opening in the third insulating film so as to expose the fourth conductive film;
   forming a light emitting layer at least in the second opening; and
   forming a fifth conductive film over the third insulating film and the light emitting layer.

8. The method for manufacturing a semiconductor device according to claim 7, further comprising:
   forming a transistor over the substrate before forming the first insulating film,
   wherein the first insulating film is formed over the transistor, and
   wherein the first conductive film is electrically connected to the transistor through the first opening in the first insulating film.

9. The method for manufacturing a semiconductor device according to claim 7, wherein the conductive layer and the columnar conductive member are formed in different positions from each other.

10. The method for manufacturing a semiconductor device according to claim 7, wherein the first conductive film is used as an etching stopper.

11. The method for manufacturing a semiconductor device according to claim 7, wherein the semiconductor device is one of a television receiving set, a laptop personal computer and an image reproducing device.

12. A method for manufacturing a semiconductor device comprising the steps of:
    forming a first insulating film over a substrate;
    forming a first opening in the first insulating film;
    forming a first conductive film over the first insulating film and in the first opening;
    forming a second conductive film over the first conductive film and in the first opening so as to fill in the first opening;
    etching the second conductive film so as to form a conductive layer in the first opening and a columnar conductive member on a portion of the second conductive film, the portion being located apart from the first opening;
    forming a third conductive film over the first conductive film, the conductive layer, and the columnar conductive member, thereby, forming a projection over the columnar conductive member;
    forming a second insulating film over the third conductive film;
    forming a fourth conductive film over the second insulating film and the third conductive film so as to be electrically connected to a top surface of the projection;
    forming a liquid crystal layer over the second insulating film and the fourth conductive film; and
    forming a fifth conductive film over the liquid crystal layer.

13. The method for manufacturing a semiconductor device according to claim 12, further comprising:
    forming a transistor over the substrate before forming the first insulating film,
    wherein the first insulating film is formed over the transistor, and
    wherein the first conductive film is electrically connected to the transistor through the first opening in the first insulating film.

14. The method for manufacturing a semiconductor device according to claim 12, wherein the conductive layer and the columnar conductive member are formed in different positions from each other.

15. The method for manufacturing a semiconductor device according to claim 12, wherein the first conductive film is used as an etching stopper.

16. The method for manufacturing a semiconductor device according to claim 12, wherein the semiconductor device is one of a television receiving set, a laptop personal computer and an image reproducing device.

* * * * *